United States Patent
Wang et al.

(10) Patent No.: US 9,748,162 B2
(45) Date of Patent: Aug. 29, 2017

(54) CHIP TO WAFER PACKAGE WITH TOP ELECTRODES AND METHOD OF FORMING

(71) Applicant: China Wafer Level CSP Co., Ltd., Suzhou (CN)

(72) Inventors: Zhiqi Wang, Suzhou (CN); Junjie Li, Suzhou (CN); Ying Yang, Suzhou (CN); Qiong Yu, Suzhou (CN); Wei Wang, Suzhou (CN)

(73) Assignee: China Wafer Level CSP Co., Ltd., Suzhou, Jiangsu (CN)

( * ) Notice: Subject to any disclaimer, the term of this patent is extended or adjusted under 35 U.S.C. 154(b) by 0 days.

(21) Appl. No.: 14/590,891

(22) Filed: Jan. 6, 2015

(65) Prior Publication Data
US 2015/0200153 A1   Jul. 16, 2015

(30) Foreign Application Priority Data
Jan. 16, 2014   (CN) .......................... 2014 1 0018025

(51) Int. Cl.
*H01L 23/48* (2006.01)
*H01L 25/07* (2006.01)
(Continued)

(52) U.S. Cl.
CPC ...... *H01L 23/481* (2013.01); *H01L 21/76802* (2013.01); *H01L 21/76877* (2013.01);
(Continued)

(58) Field of Classification Search
None
See application file for complete search history.

(56) References Cited

U.S. PATENT DOCUMENTS

| 6,348,728 B1 | 2/2002 | Aiba et al. |
| 7,064,401 B2 * | 6/2006 | Uchiyama ........... H01L 41/0986 257/254 |

(Continued)

FOREIGN PATENT DOCUMENTS

| CN | 1527415 A | 9/2004 |
| CN | 1677634 A | 10/2005 |

(Continued)

OTHER PUBLICATIONS

Definition of cover downloaded from URL http://www.merriam-webster.com/dictionary/cover on Aug. 3, 2015.*
(Continued)

*Primary Examiner* — Joseph Schoenholtz
(74) *Attorney, Agent, or Firm* — Wolf, Greenfield & Sacks, P.C.

(57) ABSTRACT

A chip package and a method for forming the same are provided. The method includes: providing a first chip, wherein the first chip comprises a first surface and a second surface, and a first plurality of pads are disposed on the first surface; providing a second chip, wherein the second chip comprises a third surface and a fourth surface, a second plurality of pads are disposed on the third surface; combining the second surface of the first chip and the third surface of the second chip, wherein the second plurality of pads are out of the combination area of the first chip and the second chip; and forming a first insulation layer, wherein the first insulation layer covers the first chip, and is combined with the second chip. Processes of the method are simple, and the chip package is small.

15 Claims, 12 Drawing Sheets

(51) Int. Cl.
*H01L 23/00* (2006.01)
*H01L 25/00* (2006.01)
*H01L 21/768* (2006.01)
*H01L 23/31* (2006.01)
*H01L 25/065* (2006.01)

(52) U.S. Cl.
CPC ............. *H01L 24/24* (2013.01); *H01L 24/32* (2013.01); *H01L 24/82* (2013.01); *H01L 24/83* (2013.01); *H01L 24/94* (2013.01); *H01L 24/97* (2013.01); *H01L 25/071* (2013.01); *H01L 25/50* (2013.01); *H01L 23/3114* (2013.01); *H01L 24/13* (2013.01); *H01L 24/73* (2013.01); *H01L 24/92* (2013.01); *H01L 25/0657* (2013.01); *H01L 2224/04105* (2013.01); *H01L 2224/12105* (2013.01); *H01L 2224/131* (2013.01); *H01L 2224/13022* (2013.01); *H01L 2224/13024* (2013.01); *H01L 2224/13111* (2013.01); *H01L 2224/13144* (2013.01); *H01L 2224/13147* (2013.01); *H01L 2224/24137* (2013.01); *H01L 2224/24146* (2013.01); *H01L 2224/2919* (2013.01); *H01L 2224/32145* (2013.01); *H01L 2224/73217* (2013.01); *H01L 2224/73267* (2013.01); *H01L 2224/82039* (2013.01); *H01L 2224/92144* (2013.01); *H01L 2224/92244* (2013.01); *H01L 2224/94* (2013.01); *H01L 2224/97* (2013.01); *H01L 2225/06524* (2013.01); *H01L 2225/06568* (2013.01); *H01L 2924/12042* (2013.01)

(56) References Cited

U.S. PATENT DOCUMENTS

| | | | |
|---|---|---|---|
| 7,507,658 B2 | 3/2009 | Usui et al. | |
| 7,825,520 B1* | 11/2010 | Longo | H01L 24/19 257/686 |
| 8,304,917 B2* | 11/2012 | Fan | H01L 23/525 257/686 |
| 8,476,720 B2* | 7/2013 | Liu | 257/415 |
| 8,698,298 B2 | 4/2014 | Henrik et al. | |
| 8,895,440 B2* | 11/2014 | Choi | H01L 21/561 438/113 |
| 8,916,481 B2* | 12/2014 | Gan | H01L 25/105 438/127 |
| 2001/0038151 A1 | 11/2001 | Takahashi et al. | |
| 2004/0183403 A1 | 9/2004 | Uchiyama et al. | |
| 2005/0169033 A1* | 8/2005 | Sugita et al. | 365/63 |
| 2005/0212091 A1* | 9/2005 | Usui | H01L 21/76814 257/621 |
| 2010/0276800 A1* | 11/2010 | Yanase | H01L 21/4832 257/737 |
| 2011/0316117 A1* | 12/2011 | Kripesh | H01L 21/3121 257/531 |
| 2012/0032340 A1* | 2/2012 | Choi | H01L 21/561 257/774 |
| 2012/0306068 A1 | 12/2012 | Saito | |
| 2013/0249075 A1* | 9/2013 | Tateiwa | H05K 1/185 257/734 |
| 2014/0159212 A1* | 6/2014 | Hung | H01L 23/3135 257/666 |
| 2014/0353775 A1* | 12/2014 | Formosa et al. | 257/415 |
| 2015/0001727 A1* | 1/2015 | Lee | H01L 24/85 257/769 |
| 2015/0137374 A1* | 5/2015 | Chen | H01L 23/53238 257/751 |
| 2016/0049371 A1* | 2/2016 | Lee | H01L 21/76898 257/621 |
| 2017/0032977 A1* | 2/2017 | Chen | H01L 21/4857 |

FOREIGN PATENT DOCUMENTS

| | | |
|---|---|---|
| CN | 101651122 A | 2/2010 |
| CN | 101877349 A | 11/2010 |
| CN | 102097427 A | 6/2011 |
| CN | 102810484 A | 12/2012 |
| CN | 203746825 U | 7/2014 |
| JP | 2001-298149 | 10/2001 |
| TW | 455962 B | 9/2001 |

OTHER PUBLICATIONS

EVG Group, Introduction to 3D IC, Nov. 1, 2013 downloaded from URL <http://www.evgroup.com/en/solutions/3d-ic/introduction> on Aug. 3, 2015.*

Figure 3 of Introduction to 3D IC downloaded from URL <http://www.evgroup.com/images/content/solutions/104120/W2W-and-C2W-integration-tall.jpg> on Aug. 3, 2015.*

Chinese Office Action, dated Feb. 2, 2016, from Chinese Application No. 201410018025.4.

Chinese Office Action, dated Jul. 6, 2016, from related Chinese Application No. 201410018025.4.

Third Chinese Office Action for Application No. 201410018025., 4 issued Nov. 7, 2016.

* cited by examiner

100

S101 — providing a first chip, wherein the first chip includes a first surface and a second surface opposite to the first surface, and a first plurality of pads are disposed on the first surface of the first chip; providing a second chip, wherein the second chip includes a third surface and a fourth surface opposite to the third surface, a second plurality of pads are disposed on the third surface of the second chip, and the area of the second chip is larger than the area of the first chip S102 — combining the second surface of the first chip and the third surface of the second chip, wherein the second plurality of pads are out of the combination area of the first chip and the second chip S103 — forming a first insulation layer, wherein the first insulation layer covers the first chip, and is combined with the second chip, the first insulation layer covers the first plurality of pads and the second plurality of pads S104 — etching the first insulation layer to form a first plurality of openings exposing the first plurality of pads, and a second plurality of openings exposing the second plurality of pads S105 — forming a plurality of metal interconnection structures, wherein the plurality of metal interconnection structures cover bottoms and sidewalls of the first plurality of openings and the second plurality of openings, and a part of the top surface of the first insulation layer; and the plurality of metal interconnection structures are electrically connected with the first plurality of pads and the second plurality of pads S106 — forming a second insulation layer on the first insulation layer and the plurality of metal interconnection structures, wherein the second insulation layer has a third plurality of openings exposing parts of the plurality of metal interconnection structures S107 — forming a plurality of metal pillars in the third plurality of openings, wherein the plurality of metal pillars are electrically connected with the plurality of metal interconnection structures, and are higher than the top surface of the second insulation layer

FIG. 2

CHIP TO WAFER PACKAGE WITH TOP ELECTRODES AND METHOD OF FORMING

CROSS-REFERENCE TO RELATED APPLICATIONS

The present application claims priority to Chinese patent application No. 201410018025.4, filed on Jan. 16, 2014, and entitled "CHIP PACKAGE AND METHOD FOR FORMING THE SAME", the entire disclosure of which is incorporated herein by reference.

TECHNICAL FIELD

The present disclosure generally relates to semiconductor technology, and more particularly, to a chip package and a method for forming the same.

BACKGROUND

With the development of manufacturing, integration and packaging technologies of semiconductor chips, electronic systems are gradually trending to have multi functions, high performance and high reliability. A system-level packaging method is developed to encapsulate components with different functions into a single package to provide different functions. The components with different functions may include active components, passive components, MEMS, optical components, etc.

A system-level chip package can be used as a final electronic product or a standard unit to be mounted on a PCB (Printed Circuit Board). Compared with a conventional chip package, the system-level chip package can be used not only in digital systems, but also in optical communication, sensor, MEMS, etc. Therefore, the system-level chip package can be widely used in fields of computer, automation, communication, etc.

A wire bonding technology is adapted in the conventional system-level packaging method to electrically connect pads of different chips using metal wires. Alternatively, in the conventional system-level packaging method, two chips may be electrically connected after their surfaces with pads are bonded face to face. However, processes of the conventional packaging method are complex.

SUMMARY

A method for forming a chip package is provided in embodiments of the present disclosure.

In one embodiment, the method may include: providing a first chip, wherein the first chip includes a first surface and a second surface opposite to the first surface, and a first plurality of pads are disposed on the first surface of the first chip; providing a second chip, wherein the second chip includes a third surface and a fourth surface opposite to the third surface, a second plurality of pads are disposed on the third surface of the second chip, and the area of the second chip is larger than the area of the first chip; combining the second surface of the first chip and the third surface of the second chip, wherein the second plurality of pads are out of the combination area of the first chip and the second chip; and forming a first insulation layer, wherein the first insulation layer covers the first chip, and is combined with the second chip.

In some embodiments, the second surface of the first chip and the third surface of the second chip are combined through an insulation adhesive layer.

In some embodiments, a sum of the combination area between the first insulation layer and the second chip and the combination area between the insulation adhesive layer and the second chip is larger than the area of the first chip.

In some embodiments, the first insulation layer includes a photosensitive dry film, a non-photosensitive dry film or a molding material.

In some embodiments, the first insulation layer covers the first plurality of pads and the second plurality of pads.

In some embodiments, the method may further include: etching the first insulation layer to form a first plurality of openings exposing the first plurality of pads, and a second plurality of openings exposing the second plurality of pads; and forming a plurality of metal interconnection structures, wherein the plurality of metal interconnection structures are electrically connected with the first plurality of pads, the second plurality of pads, or the first plurality of pads and the second plurality of pads.

In some embodiments, the plurality of metal interconnection structures cover bottoms and sidewalls of the first plurality of openings and the second plurality of openings, and parts of the top surface of the first insulation layer, so that the plurality of metal interconnection structures are electrically connected with the first plurality of pads, the second plurality of pads, or the first plurality of pads and the second plurality of pads.

In some embodiments, the method may further include: forming a first plurality of plugs in the first plurality of openings; and forming a second plurality of plugs in the second plurality of openings, wherein the plurality of metal interconnection structures are formed on the first insulation layer, and the plurality of metal interconnection structures are electrically connected with the first plurality of pads through the first plurality of plugs, the second plurality of pads through the second plurality of plugs, or the first plurality of pads and the second plurality of pads through the first plurality of plugs and the second plurality of plugs.

In some embodiments, the method may further include: forming a second insulation layer on the first insulation layer and the plurality of metal interconnection structures, wherein the second insulation layer has a third plurality of openings exposing parts of the plurality of metal interconnection structures; and forming a plurality of metal pillars in the third plurality of openings, wherein the plurality of metal pillars are electrically connected with the plurality of metal interconnection structures, and are higher than the top surface of the second insulation layer.

In some embodiments, the second chip is a part of a wafer, and after forming the plurality of metal pillars, the method further includes: cutting the wafer to form a package structure comprising the first chip and the second chip.

In some embodiments, a number of the first chip is one or more, a number of the second chip is one or more, the second surfaces of the one or more first chips are combined with the third surfaces of the one or more second chips, and the first plurality of pads of the one or more first chips are electrically connected with the second plurality of pads of the one or more second chips through the plurality of metal interconnection structures, or a number of the first plurality pads of more than one first chip are connected through the plurality of metal interconnection structures, or a number of the second plurality pads of more than one second chip are connected through the plurality of metal interconnection structures.

Correspondingly, a chip package is provided in embodiments of the present disclosure. In one embodiments, the chip package may include: a first chip, wherein the first chip includes a first surface and a second surface opposite to the first surface, and a first plurality of pads are disposed on the first surface the first chip; a second chip, wherein the second chip includes a third surface and a fourth surface opposite to the third surface, a second plurality of pads are disposed on the third surface of the second chip, the area of the second chip is larger than the area of the first chip, the second surface of the first chip is combined with the third surface of the second chip, and the second plurality of pads are out of the combination area of the first chip and the second chip; and a first insulation layer, wherein the first insulation layer covers the first chip and is combined with the second chip.

In some embodiments, the chip package may further include: an insulation adhesive layer, disposed between the second surface of the first chip and the third surface of the second chip.

In some embodiments, a sum of the combination area between the first insulation layer and the second chip and the combination area between the insulation adhesive layer and the second chip is larger than the area of the first chip.

In some embodiments, the first insulation layer is a photosensitive dry film, a non-photosensitive dry film or a molding material.

In some embodiments, the first insulation layer has a first plurality of openings exposing the first plurality of pads and a second plurality of openings exposing the second plurality of pads; and the chip package further includes a plurality of metal interconnection structures which are electrically connected with the first plurality of pads, the second plurality of pads, or the first plurality of pads and the second plurality of pads.

In some embodiments, the plurality of metal interconnection structures cover bottoms and sidewalls of the first plurality of openings and the second plurality of openings, and parts of the top surface of the first insulation layer, so that the plurality of metal interconnection structures are electrically connected with the first plurality of pads, the second plurality of pads, or the first plurality of pads and the second plurality of pads.

In some embodiments, the chip package may further include: a first plurality of plugs, wherein the first plurality of plugs are disposed in the first plurality of openings, and are electrically connected with the first plurality of pads; and a second plurality of plugs, wherein the second plurality of plugs are disposed in the second plurality of openings, and are electrically connected with the second plurality of pads, wherein the plurality of interconnection structures are disposed on the first insulation layer, and are electrically connected with the first plurality of pads through the first plurality of plugs, the second plurality of pads through the second plurality of plugs, or the first plurality of pads and the second plurality of pads through the first plurality of plugs and the second plurality of plugs.

In some embodiments, the chip package may further include: a second insulation layer, wherein the second insulation layer is disposed on the first insulation layer and the plurality of metal interconnection structures, and has a third plurality of openings exposing parts of the plurality of metal interconnection structures; and a plurality of metal pillars, wherein the plurality of metal pillars are disposed in the third plurality of openings, and are higher than the top surface of the second insulation layer.

In some embodiments, a number of the first chip is one or more, a number of the second chip is one or more, the second surfaces of the one or more first chips are combined with the third surfaces of the one or more second chips, and the first plurality of pads of the one or more first chips are electrically connected with the second plurality of pads of the one or more second chips through the plurality of metal interconnection structures, or a number of the first plurality pads of more than one first chip are connected through the plurality of metal interconnection structures, or a number of the second plurality pads of more than one second chip are connected through the plurality of metal interconnection structures.

Compared with the conventional technology, embodiments of the present disclosure have following advantages.

In embodiments of the present disclosure, the second surface without pads of the first chip is combined with the third surface of the second chip. Thus, locations of the pads on the first chip do not need to correspond to locations of the pads on the second chip, which means there is no need to form redistribution layers. Therefore, the processes for forming the chip package are simplified. Furthermore, attribute to the absence of redistribution layers on the first chip and the second chip, the first chip and the second chip can be made thinner to obtain a smaller chip package. In addition, the first insulation layer is formed after the combination of the first chip and the second chip. The first insulation layer covers the first chip and is combined with the second chip. Thus, the bonding strength between the first chip and the second chip is enhanced, the first chip cannot be easily peeled off from the second chip, and the reliability of the entire chip package is improved.

Furthermore, in embodiments of the present disclosure, the metal pillars are redistributed onto the insulation layer by forming the insulation layer and the metal interconnection structures. Thus, the metal pillars are higher than the first chip. There is no need to form additional openings in the PCB, and the package of the first chip and the second chip can be directly combined with the PCB through the metal pillars. Therefore, the processes for forming the chip package are simplified.

Correspondingly, the chip package in embodiments of the present disclosure also has the above advantages.

BRIEF DESCRIPTION OF THE DRAWINGS

FIG. 2 schematically illustrates a flow chart of a method 100 for forming a chip package according to one embodiment of the present disclosure;

DETAILED DESCRIPTION

Figure 1:
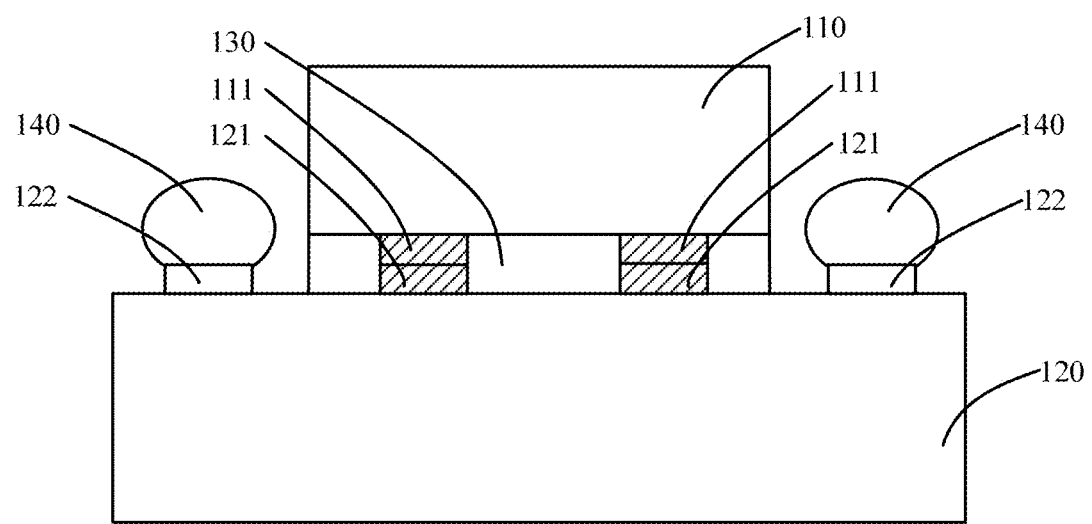
FIG. 1 schematically illustrates a cross-sectional structure diagram of a conventional chip package.

Inventors of the present disclosure found that, in a packaging process for electrically connecting two chips, surfaces with pads of the two chips are usually connected. Referring to FIG. 1, a cross-sectional structure diagram of a conventional system-level package for combining two different scale chips is schematically illustrated. The package includes: a first chip 110, wherein a first plurality of pads 111 are disposed on a surface of the first chip; a second chip 120, wherein the area of the second chip 120 is larger than the area of the first chip 110, a second plurality of pads 121 and a third plurality of pads 122 are disposed on a surface of the second chip 120, and the second plurality of pads 121 on the surface of the second chip 120 is combined with the first plurality of pads 111 on the surface of the first chip 110; an insulation adhesive layer 130, wherein the insulation adhesive layer 130 is disposed in a gap between the surface of the first chip 110 and the surface of the second chip 120, and is adapted for combining the first chip 110 and the second chip 120; and a plurality of solder balls 140, wherein the plurality of solder balls 140 are disposed on the third plurality of pads 122, and are adapted for connecting external circuits (e.g. PCB: Printed Circuit Board). However, in the above chip package, both the first plurality of pads 111 on the surface of the first chip 110 and the second plurality of pads 121 on the surface of the second chip 120 are usually redistribution layers. Insulation layers and metal layers are formed on the surfaces of the chips in order to form the redistribution layers. The redistribution layers can redistribute the pads on the chips, and then the first plurality of pads 111 on the surface of the first chip 110 can correspond to the second plurality of pads 121 on the surface of the second chip 120. However, processes for forming the redistribution layers are complex. Furthermore, because the redistribution layers are formed on the first chip 110 and the second chip 120, the first chip 110 and the second chip 120 are thick, which results a large size of the chip package.

Based on above, a method for forming a chip package is provided in embodiments of the present disclosure. The method can reduce the thickness of the chip package, improve the reliability of the chip package, and reduce the difficulty of the chip package technology.

In order to clarify the objects, characteristics and advantages of the disclosure, the embodiments of the present disclosure will be described in detail in conjunction with the accompanying drawings.

The disclosure will be described with reference to certain embodiments. It will be understood by those skilled in the art that various changes may be made without departing from the spirit or scope of the disclosure. Accordingly, the present disclosure is not limited to the embodiments disclosed.

Referring to FIG. 2, a flow chart of a method 100 for forming a chip package is schematically illustrated in FIG. 2. An embodiment of the method 100 will be described below in conjunction with the accompanying drawings. The method 100 includes Steps S101-S107.

Figure 3:
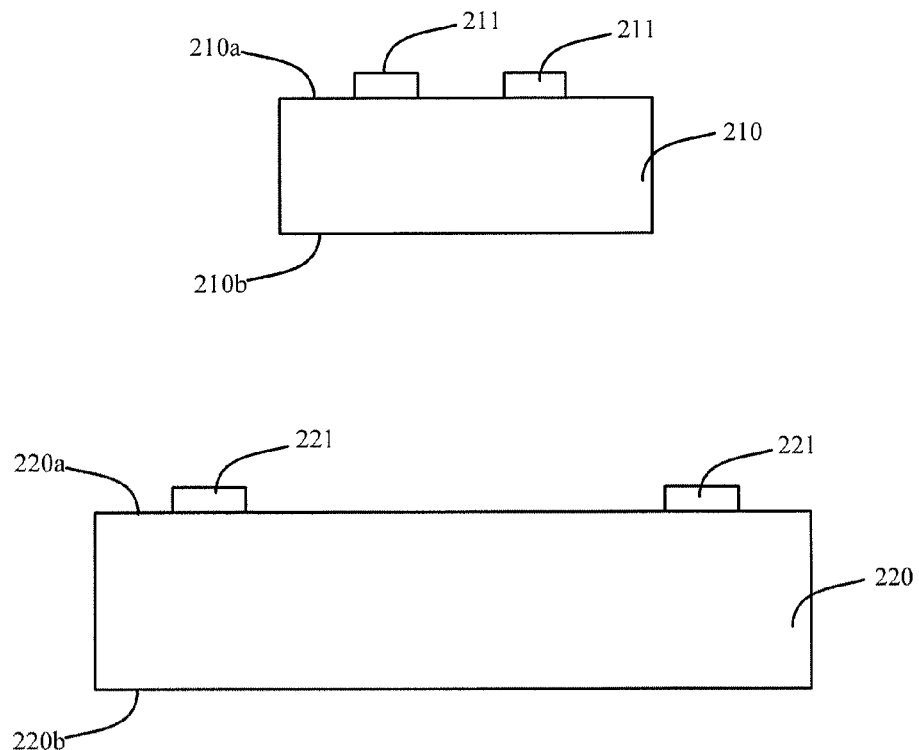
FIGS. 3-9 schematically illustrate cross-sectional views of intermediate structures of the method 100 shown in FIG. 2.

In Step S101, referring to FIG. 3, a first chip 210 is provided. The first chip 210 includes a first surface 210a and a second surface 210b opposite to the first surface 210a. A first plurality of pads 211 are disposed on the first surface 210a of the first chip 210. A second chip 220 is provided. The second chip 220 includes a third surface 220a and a fourth surface 220b opposite to the third surface 220a. A second plurality of pads 221 are disposed on the third surface 220a of the second chip 220. The area of the second chip 220 is larger than the area of the first chip 210.

The first chip 210 and the second chip 220 may include monocrystalline silicon, SOI (Silicon On Insulator), SiGe or III-V compound material. The first chip 210 and the second chip 220 also include semiconductor devices, metal interconnection structures and other semiconductor structures fabricated therein. The first chip 210 and the second chip 220 are a broad conception. The first chip 210 and the second chip 220 may include an integrated circuit chip, such as a processor, a memory, a controller, etc. The first chip 210 and the second chip 220 may also include an optical sensor chip (e.g., a CCD (Charge Coupled Device), a CMOS image sensor, etc.), a thermal sensor chip, a motion sensor chip or other sensor chips. The first chip 210 and the second chip 220 may also include a MEMS (Micro-electromechanical Systems) chip.

In one embodiment, the first plurality pads 211 and the second plurality of pads 221 are top metal electrodes or pads on the top metal electrodes of the first chip 210 and the second chip 220, respectively. The first plurality of pads 211 and the second plurality of pads 221 may include gold, copper, aluminum or silver. In some embodiments, the first plurality of pads 211 and the second plurality of pads 221 are redistribution layers.

Figure 4:
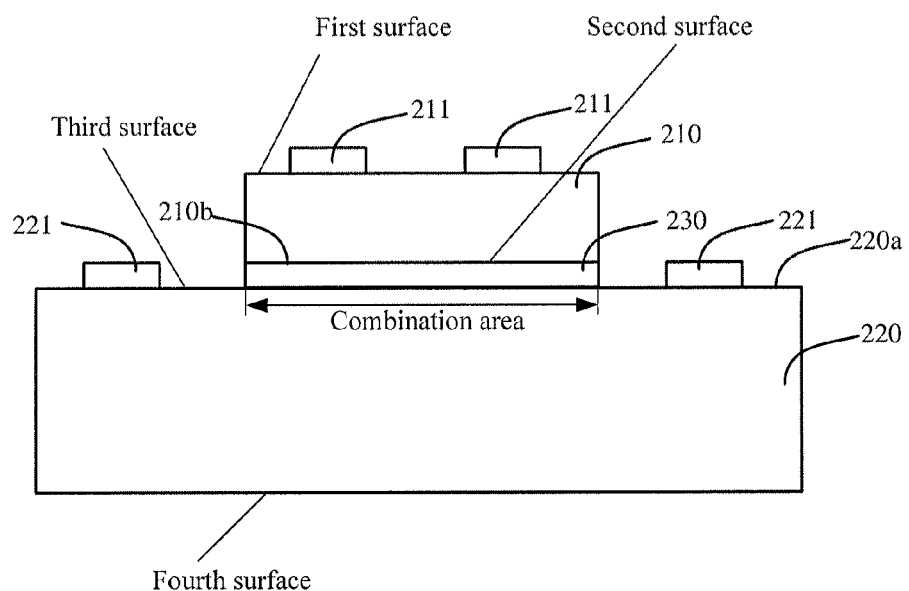

In Step S102, referring to FIG. 4, the second surface 210b of the first chip 210 and the third surface 220a of the second chip 220 are combined. The second plurality of pads 221 are out of the combination area of the first chip 210 and the second chip 220.

In some embodiments, an insulation adhesive layer 230 is formed on the second surface 210b of the first chip 210 to combine the second surface 210b of the first chip and the third surface 220a of the second chip 220. In some embodiments, the insulation adhesive layer 230 is formed on an area to be combined with the third surface 220a of the second chip 220, so as to combine the second surface 210b of the first chip 210 and the third surface 220a of the second chip 220. The insulation adhesive layer 230 may include insulation silicone, polyimide, BCB resin, etc. The insulation adhesive layer 230 is used to bond the second surface 210b of the first chip 210 and the third surface 220a of the second chip 220, and to enhance the bonding strength between them.

In one embodiment, before the combination of the second surface 210b of the first chip 210 and the third surface 220a of the second chip 220, a thinning process is performed on the first chip 210 and the second chip 220. By thinning the first chip 210 and the second chip 220, the thickness of the chip package can be reduced. The thinning process is known to those skilled in the art, and is not described in detail herein.

Compared with the conventional technology, because the second surface 210b of the first chip 210 are combined with the second chip 220 in this embodiment, the first plurality of pads 211 on the first chip 210a of the first chip 210 don't need to correspond to pads on the second chip 220, and there is also no need to form redistribution layers on the first chip 210 and the second chip 220. Therefore, the processes of this embodiment are simple. Furthermore, because there is no need to form redistribution layers on the first chip 210 and the second chip 220 in this embodiment, thicknesses of the first chip 210 and the second chip 220 can be made thinner. Therefore, the size of the chip package can be reduced.

Figure 5:
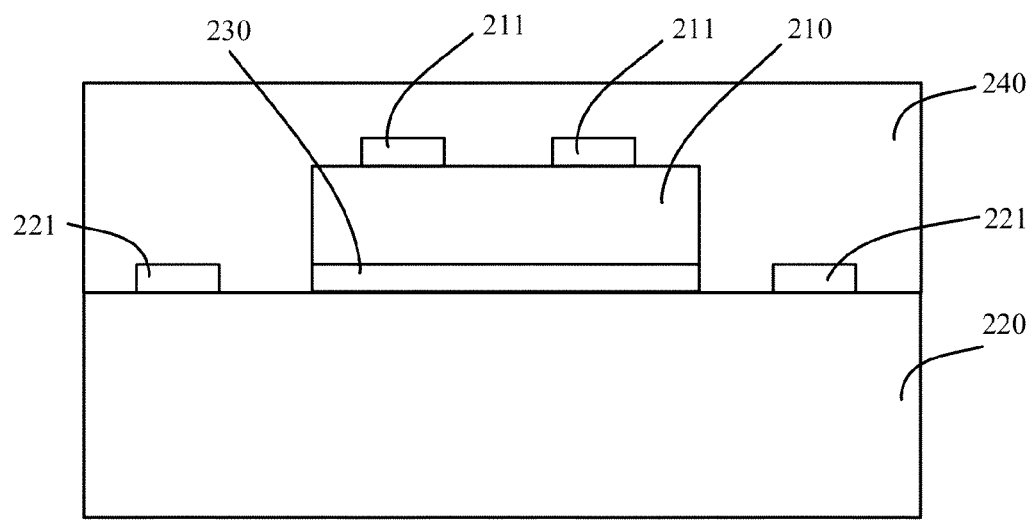

In Step S103, referring to FIG. 5, a first insulation layer 240 is formed. The first insulation layer 240 covers the first chip 210 and is combined with the second chip 220. The first insulation layer 240 covers the first plurality of pads 211 and the second plurality of pads 221.

In one embodiment, the first insulation layer 240 may be a photosensitive dry film. The photosensitive dry film is a polymer compound, for example, polyimide, epoxy, silicone, benzocyclobutene, etc. After an UV irradiation, the photosensitive dry film can polymerize to form a stable layer adhering to the first chip 210 and the second chip 220. In one embodiment, a vacuum coating method is used to form the photosensitive dry film. The method may include: disposing the photosensitive dry film, and the package of the first chip 210 and the second chip 220 in a vacuum chamber; and coating the photosensitive dry film on the first chip 210, wherein the photosensitive dry film covers the first chip 210 and is combined with the third surface 220a of the second chip 220. The vacuum chamber can prevent formation of bubbles between the photosensitive dry film and the first chip 210 or the second chip 220. Therefore, the photosensitive dry film can be tightly bonded on the first chip 210 and the second chip 220. In one embodiment, the photosensitive dry film covers the first plurality of pads 211 and the second plurality of pads 221. A sum of the combination area between the first insulation layer 240 and the second chip 220 and the combination area between the insulation adhesive layer 230 and the second chip 220 is larger than the area of the first chip 210.

In some embodiments, the first insulation layer 240 may be non-photosensitive dry film. Similarly, the non-photosensitive film can be formed by the vacuum coating method as described above.

In one embodiment, the first insulation layer 240 may be a molding material. The molding material is filled in a corresponding mold by an injection molding process to cover the first chip 210 and be combined with the third surface 220a of the second chip 220. The molding material forms the first insulation layer 240 after being heated up and curing.

In some embodiments, the first insulation layer 240 may be other insulation materials.

In this embodiment, the photosensitive dry film is 5~20 μm higher than the first chip 210. In other embodiments, if the first insulation layer 240 use other insulation materials, the thickness of the first insulation layer 240 depends on its insulation capability. The thickness of the first insulation layer 240 should prevent a current leakage.

After the first insulation 240 is formed, the first insulation layer 240 covers the first chip 210 and an area out of a projection area of the first chip 210 on the second chip 220, and is combined with the second chip 220.

In the conventional technology, referring to FIG. 1, the first chip 110 and the second chip 120 are combined through the insulation adhesive layer 130. The insulation adhesive layer 130 only has a same area as the first chip 110, which results a poor bonding capacity. In this embodiment, referring to FIG. 5, the first chip 210 and the second chip 220 are combined not only by the insulation adhesive layer 230, but also by the first insulation layer 240. The first insulation layer 240 covers the first chip 210 and is combined with the second chip 220, so that the bonding strength between the first chip 210 and the second chip 220 is enhanced. Therefore, the first chip 210 cannot be easily peeled off from the second chip, and the reliability of the entire chip package is improved.

Figure 6:
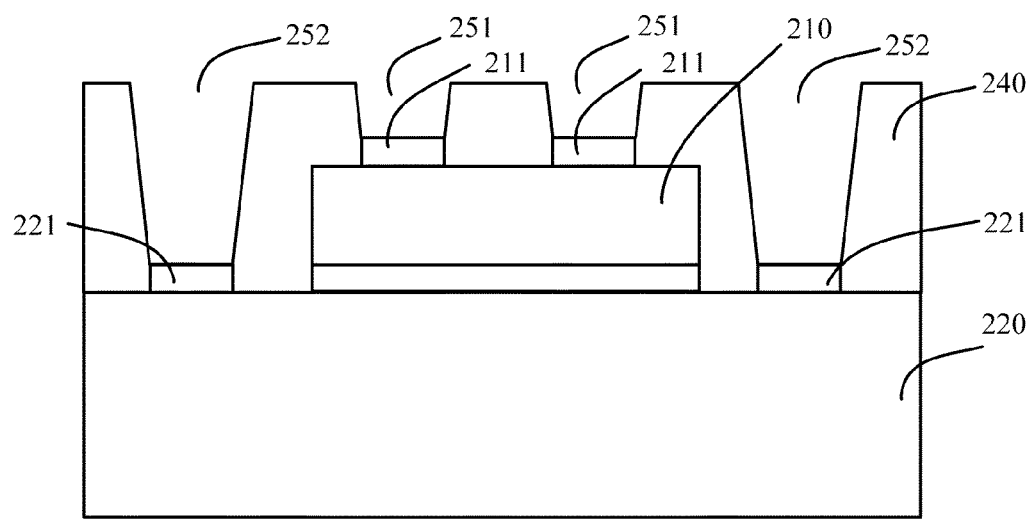

In Step S104, referring to FIG. 6, the first insulation layer 240 is etched to form a first plurality of openings 251 exposing the first plurality of pads 211, and a second plurality of openings 252 exposing the second plurality of pads 221.

In some embodiments, if the first insulation layer 240 is a photosensitive dry film, a lithography process may be employed to form the first plurality of openings 251 and the second plurality of openings 252. Specifically, at first, ultraviolet light is used to irradiate an area of the photosensitive dry film, which is out of an area of the first plurality of openings 251 and the second plurality of openings 252, and a polymerization reaction is caused to form a stable material to prevent etching in subsequent processes. Then, an etching process is employed to remove the area which is not irradiated by the ultraviolet light, to form the first plurality of openings 251 and the second plurality of openings 252. The first plurality of openings 251 expose the first plurality of pads 211 on the first chip 210, and the second plurality of openings 252 expose the second plurality of pads 221 on the second chip 220.

In some embodiments, if the first insulation layer 240 is a molding material, a laser process may be used to form the first plurality of openings 251 and the second plurality of openings 252. Specifically, a laser is used to heat up an area which will be cut later on the molding material, and temperature of the area to be cut rises quickly. Then, molding material of the irradiated area is gasified, and the first plurality of openings 251 and the second plurality of openings 252 are formed correspondingly. In one embodiment, a width of the laser pulse is 1 ns~200 ns, a frequency of the laser pulse is 80~200 KHz, and laser energy at the point of focus is greater than 1E18 W/cm$^2$. By using the laser process, the molding material can be selectively removed without forming a mask. Heat generated in the laser process is concentrated in a specific region. Moreover, the laser process is a non-contact etching process and reaction byproducts are gases, so that contamination of the first insulation layer 240 is little.

In some embodiments, the first insulation layer 240 is a non-photosensitive dry film. Similarly, the laser process described above can be used to form the first plurality of openings 251 and the second plurality of openings 252.

In some embodiments, sidewalls of the first plurality openings 251 and the second plurality of openings 252 may be perpendicular to the surface of the second chip 220. In some embodiments, sidewalls of the first plurality openings 251 and the second plurality of openings 252 may not be perpendicular to the surface of the second chip 220, and tops of the first plurality of openings 251 and the second plurality of openings 252 are wider than bottoms, which is benefit to form a metal layer covering the bottoms and the sidewalls of the first plurality of openings 251 and the second plurality of openings 252 in subsequent processes.

It should be noted that, the first plurality of openings 251 and the second plurality of openings 252 may be formed in different steps. Because the first chip 210 is bonded on the surface of the second chip 220, the first plurality of pads 211 on the first surface of the first chip 210 is higher than the second plurality of pads 221 on the third surface of the second chip 220. Therefore, in the etching process to form the first plurality of openings 251 and the second plurality of openings 252, thicknesses of the insulation layer 240 to be etched on the first plurality of pads 211 and the second plurality of pads 221 are different. In some embodiments, the first plurality of openings 251 and the second plurality of openings 252 can be formed in different steps. For example, the first plurality of openings 251 is formed after formation of the second plurality of openings 252. Thus, it can prevent damages of the first plurality of pads 211 and the second plurality of pads 221, which are caused by the different etching thicknesses of the different parts of the first insulation layer 240.

Figure 7:
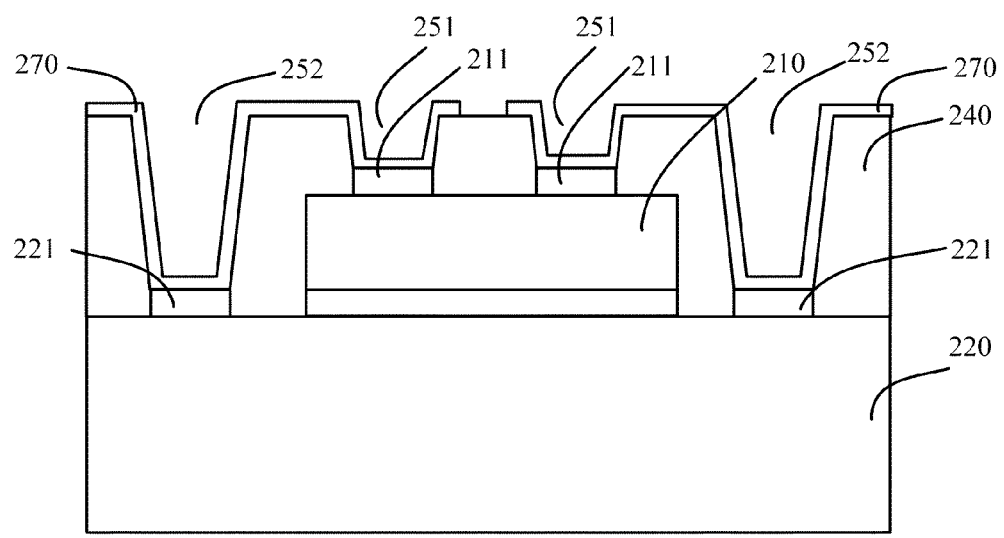

In Step S105, referring to FIG. 7, a plurality of metal interconnection structures 270 are formed. The metal interconnection structures 270 covers the bottoms and the sidewalls of the first plurality of opening 251 and the second plurality of openings 252, and parts of the top surface of the first insulation layer 240. The metal interconnection structures 270 are electrically connected with the first plurality of pads 211 and the second plurality of pads 221.

Specifically, firstly, a sputtering process, a chemical vapor deposition process or a plating process is employed to form a metal material layer. The metal material layer covers the bottoms and the sidewalls of the first plurality of openings 251 and the second plurality of openings 252, and the top surface of the first insulation layer 240. The metal material layer may include aluminum, titanium, copper or other conductive materials. Next, a lithography process is employed to form a patterned photoresist layer (not shown) on the metal material layer. The patterned photoresist layer covers an area to form the metal interconnection structures on the metal material layer. Next, an etching process is performed on the metal material layer by employing the patterned photoresist layer as a mask to obtain a patterned metal layer. Then, the patterned photoresist layer is removed, and the remaining metal material layer forms the plurality of metal interconnection structures 270. The metal interconnection structures 270 are used to connect the first plurality of pads 211 and the second plurality of pads 221. In some embodiments, one of the first plurality of pads 211 is connected with several of the second plurality of pads 221 through the metal interconnection structures 270. In some embodiments, several of the first plurality of pads 211 are connected with one of the second plurality of pads 221 through the metal interconnection structures 270. In some embodiments, parts of the first plurality of pads 211 or parts of the second plurality of pads 221 are respectively connected with the metal interconnection structures 270, so that metal pillars formed on the metal interconnection structures 270 in subsequent steps can be connected with the parts of the first plurality of pads 211 or the parts of the second plurality of pads 221 respectively.

Figure 8:
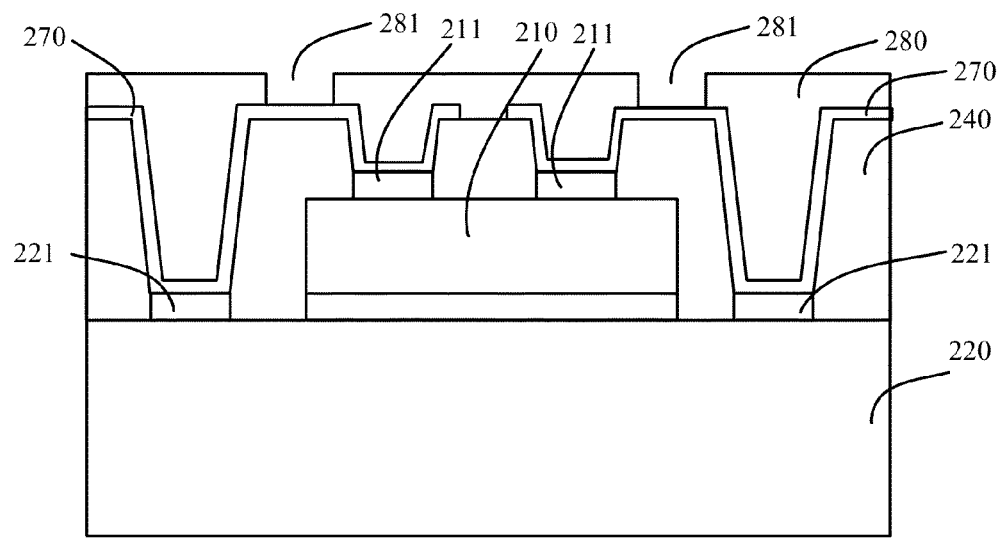

In Step S106, referring to FIG. 8, a second insulation layer 280 is formed on the first insulation layer 240 and the metal interconnection structures 270. The second insulation layer 280 has a third plurality of openings 281 exposing parts of the metal interconnection structures 270.

In some embodiments, the second insulation layer 280 may include photoresist. First, a coating process is employed to form a photoresist layer. The photoresist layer covers surfaces of the first insulation layer 240 and the metal interconnection structures 270, and fills the first plurality of openings 251 and the second plurality of openings 252 (referring to FIG. 7). Then, a lithography process is employed to form a third plurality of openings 281 in the photoresist layer. The third plurality of openings 281 expose parts of the metal interconnection structures 270.

In some embodiments, the second insulation layer 280 may include a photosensitive dry film, a non-photosensitive dry film, a molding material or other insulation material.

Figure 9:
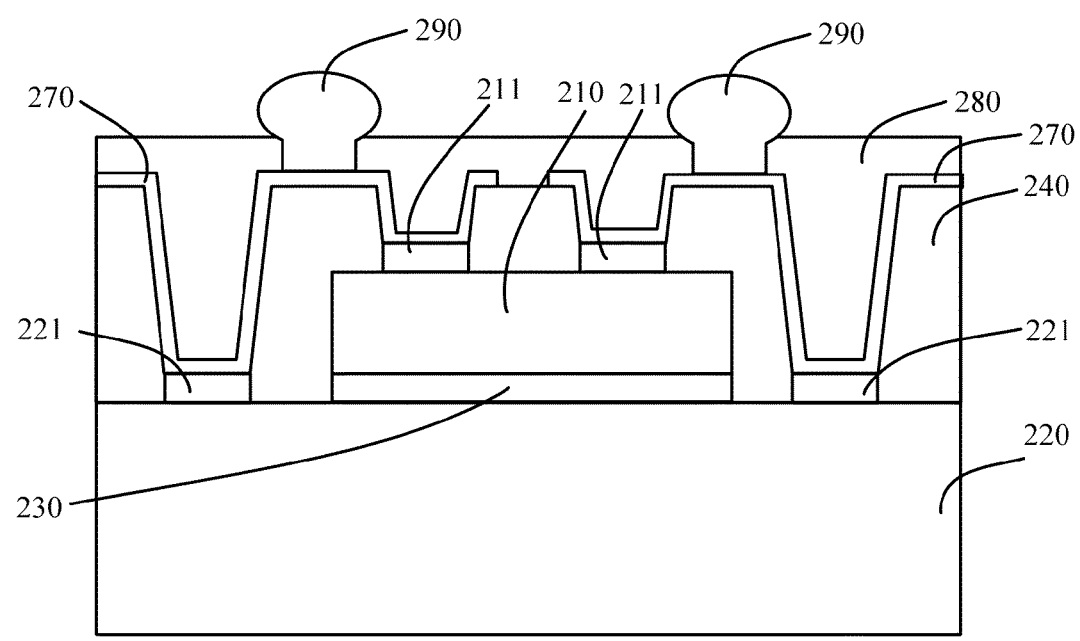

In Step S107, referring to FIG. 9, a plurality of metal pillars 290 are formed in the third plurality of openings 281 (referring to FIG. 8). The metal pillars 290 are connected with the metal interconnected structures 270, and the metal pillars 290 are higher than or equal to the top surface of the second insulation layer 280.

In some embodiments, the metal pillars 290 are solder balls. First, solder paste may be printed on surfaces of the metal interconnection structures 270. Then, a high temperature reflow process is performed to form the solder balls with an effect of surface tension. In some embodiments, soldering flux and solder balls may be printed on surfaces of the metal interconnection structures 270. Then, a high temperature reflow process is employed to form the solder balls. In some embodiments, tin columns may be electroplated on surfaces of the metal interconnection structures 270 and then a high temperature reflow process is employed to form solder balls.

In some embodiments, the metal pillars 290 may be copper columns, gold columns, solder balls, combinations of copper columns and solder balls, etc.

Referring to FIG. 1, a conventional package structure is shown in FIG. 1. Diameters of the solder balls 140 are usually smaller than the thickness of the first chip 110, and the solder balls 140 are lower than the first chip 110. Therefore, when the package structure is connected to a PCB through the solder balls 140, additional openings corresponding to the first chip 110 in the PCB should be formed to accommodate the first chip 110 and form a connection between the solder balls 140 and the PCB. Compared with the conventional structure, referring to FIG. 10, embodiments of the present disclosure redistribute the metal pillars 290 onto the second insulation layer 280 by forming the first insulation layer 240, the metal interconnection structures 270 and the second insulation layer 280. Therefore, the metal pillars 290 are higher than the first chip 210. There is no need to form additional openings in the PCB, and the package of the first chip 210 and the second chip 220 can be directly combined with the PCB through the metal pillars 290. Therefore, processes for forming the chip package are simplified.

Corresponding to the above method for forming a chip package, a chip package is provided in embodiments of the present disclosure. Referring to FIG. 9, the chip package includes: a first chip 210, a second chip 220, an insulation adhesive layer 230, a first insulation layer 240, a plurality of metal interconnection structures 270, a second insulation layer 280 and a plurality of metal pillars 290.

The first chip 210 includes a first surface (not labeled) and a second surface (not labeled) opposite to the first surface, and a first plurality of pads 211 are disposed on the first surface of the first chip 210.

The second chip 220 includes a third surface (not labeled) and a fourth surface (not labeled) opposite to the third surface. A second plurality of pads 221 are disposed on the third surface of the second chip 220. The area of the second chip 220 is larger than the area of the first chip 210. The second surface of the first chip 210 is combined with the third surface of the second chip 220. The second plurality of pads 221 are out of the combination area of the first chip 210 and the second chip 220.

The insulation adhesive layer 230 is disposed between the second surface of the first chip 210 and the third surface of the second chip 220.

The first insulation layer 240 covers the first chip 210 and is combined with the second chip 220. A sum of the combination area between the first insulation layer 240 and second chip 220 and the combination area between the insulation adhesive layer 230 and the second chip 220 is larger than the area of the first chip 210. The first insulation layer 240 has a first plurality of openings (not labeled) exposing the first plurality of pads 211, and a second plurality of openings (not labeled) exposing the second plurality of pads 221. The first insulation layer 240 may be a photosensitive dry film, a non-photosensitive dry film, or molding materials.

The metal interconnection structures 270 covers bottoms and sidewalls of the first plurality of opening and the second plurality of openings, and parts of the top surface of the first insulation layer 240. The metal interconnection structures 270 are electrically connected with the first plurality of pads 211 and the second plurality of pads 221.

The second insulation layer 280 is disposed on the first insulation layer 240 and the metal interconnection structures 270. The second insulation layer 280 has a third plurality of openings (not labeled) exposing parts of the metal interconnection structures 270.

The plurality of metal pillars 290 are disposed in the third plurality of openings. The plurality of metal pillars 290 are electrically connected with the metal interconnection structures 270, and are higher than the second insulation layer 280.

Figure 10:
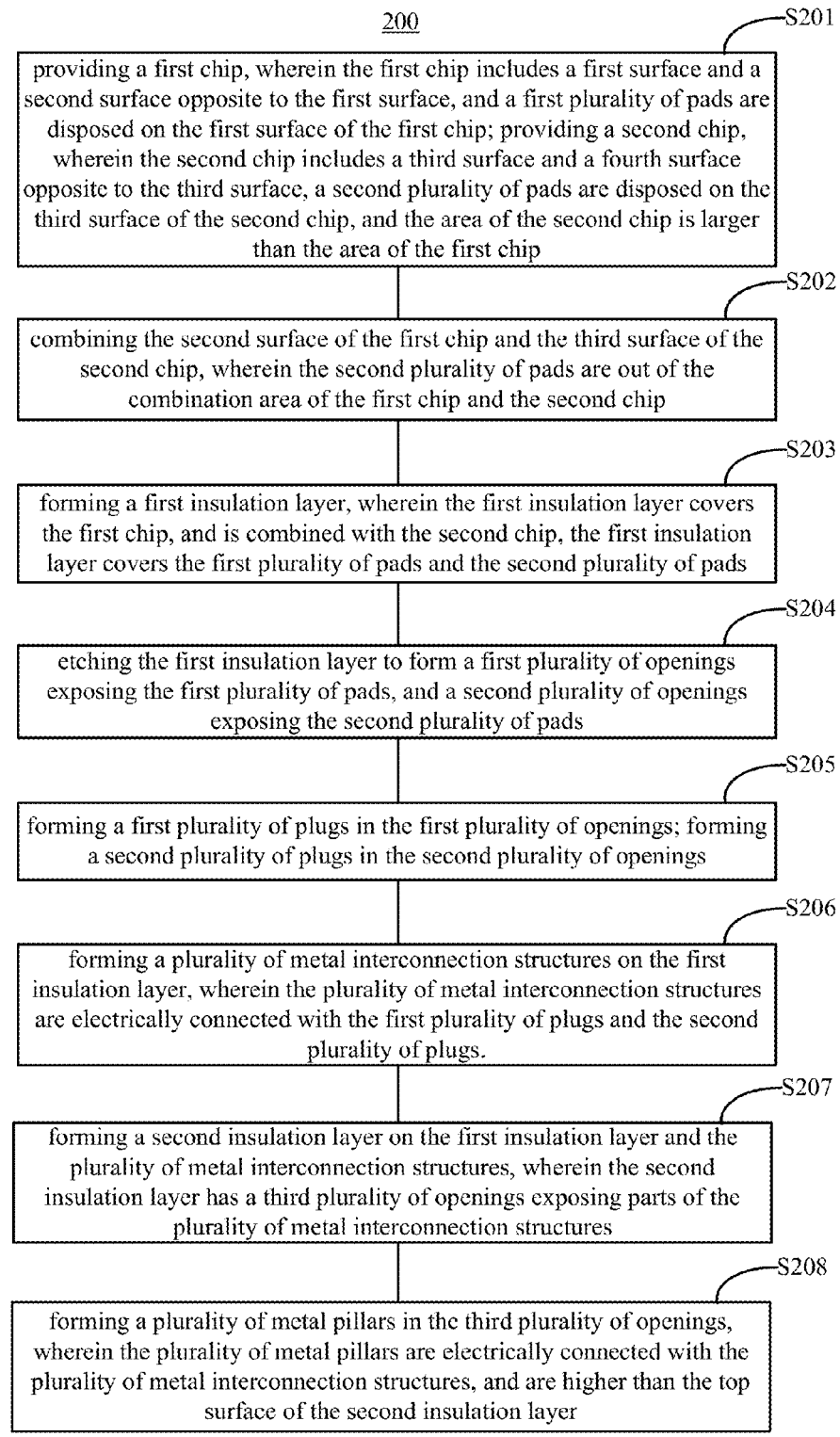
FIG. 10 schematically illustrates a flow chart of a method 200 for forming a chip package according to another embodiment of the present disclosure.

A method for forming a chip package is also provided according to another embodiment of the present disclosure. Referring to FIG. 10, a flow chart of a method 200 for forming a chip package is schematically illustrated in FIG. 10. The embodiments of the method 200 will be described below in conjunction with the accompanying drawings. For simplicity, the same or similar parts of the first method 100 and the method 200 can refer to above embodiments, and will not be described in detail herein. The method 200 includes Steps S201-S208.

Figure 11:
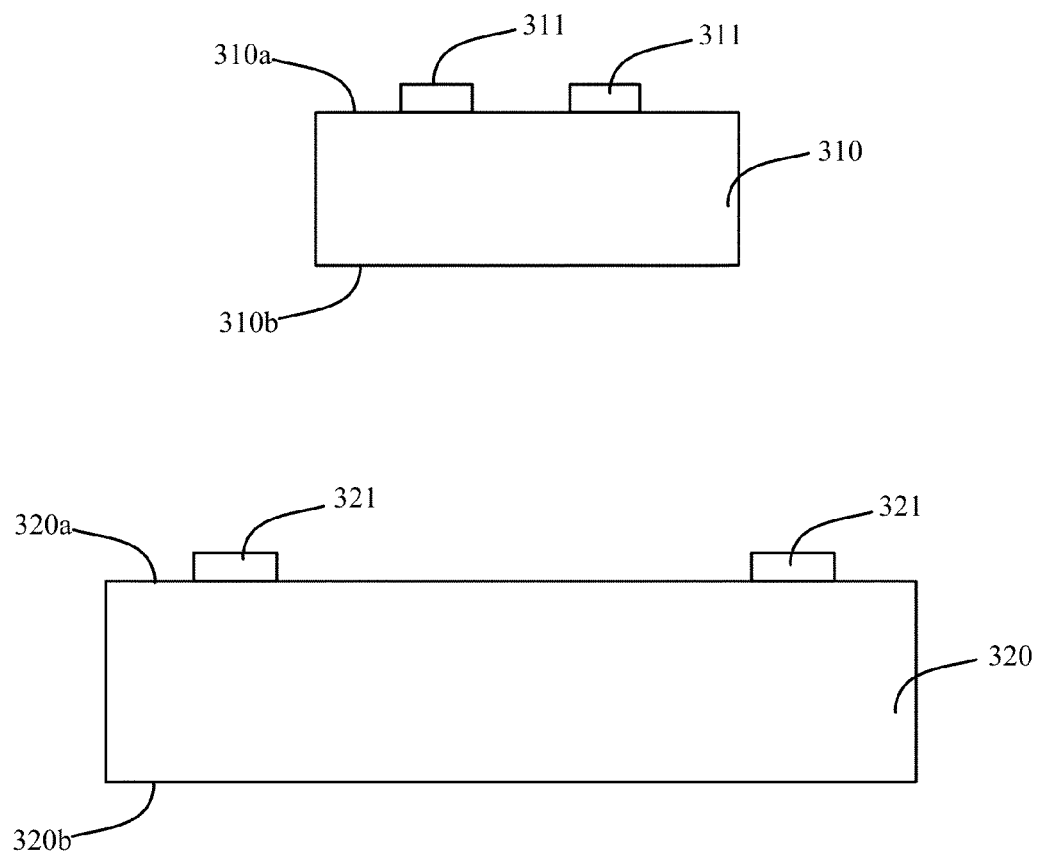
FIGS. 11-18 schematically illustrate cross-sectional views of intermediate structures of the method 200 shown in FIG. 10.

In Step S201, referring to FIG. 11, a first chip 310 is provided. The first chip 310 includes a first surface 310a and a second surface 310b opposite to the first surface 310a. A first plurality of pads 311 are disposed on the first surface 310a of the first chip 310. A second chip 320 is provided. The second chip 320 includes a third surface 320a and a fourth surface 320b opposite to the third surface 320a. A second plurality of pads 321 are disposed on the third surface 320a of the second chip 320. The area of the second chip 320 is larger than the area of the first chip 310.

Figure 12:
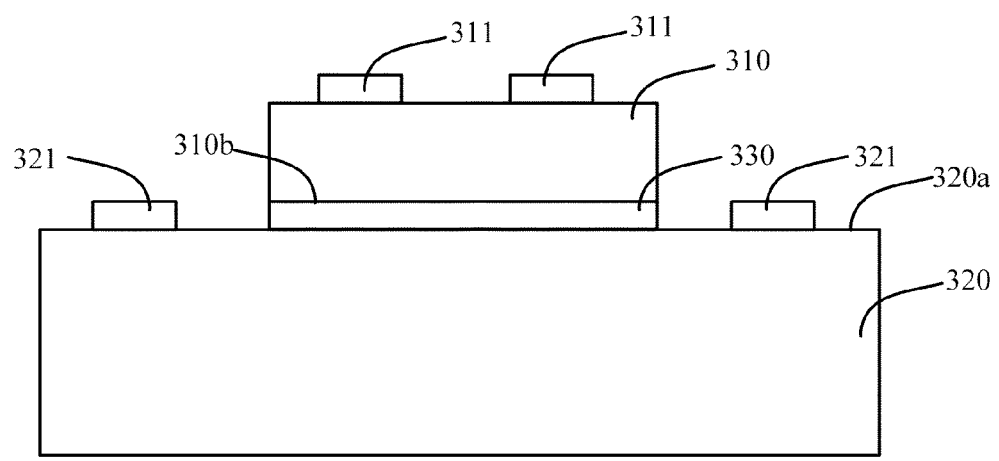

In Step S202, referring to FIG. 12, the second surface 310b of the first chip 310 and the third surface 320a of the second chip 320 are combined. The second plurality of pads 321 is out of the combination area of the first chip 310 and the second chip 320.

As described in above embodiments, because the second surface 310b of the first chip 310 is combined with the second chip 320, there is no need to form redistribution layers on the first chip 310 and the second chip 320. Therefore, processes for forming the chip package are simplified. Furthermore, the first chip 310 and the second chip 320 can be reduced to smaller thicknesses, and the chip package would be smaller.

Figure 13:
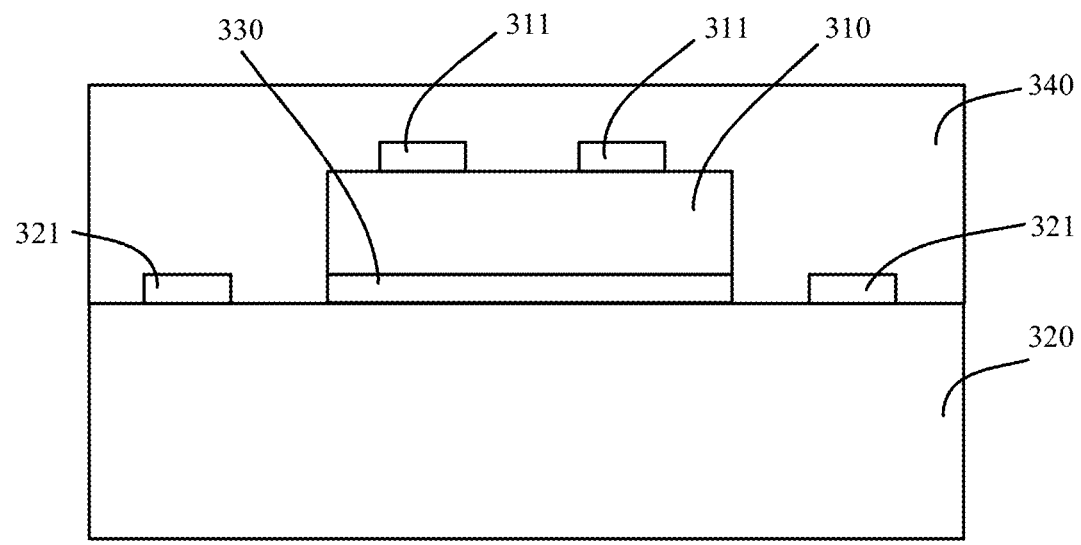

In Step S203, referring to FIG. 13, a first insulation layer 340 is formed. The first insulation layer 340 covers the first chip 310 and is combined with the second chip 320. The first insulation layer 340 also covers the first plurality of pads 311 and the second plurality of pads 321.

As described in above embodiments, the first chip 310 and the second chip 320 are combined not only by the insulation adhesive layer 330, but also by the first insulation layer 340 in this embodiment. The first insulation layer 340 covers the first chip 310 and is combined with the second chip 320, so that the bonding strength between the first chip 310 and the second chip 320 is enhanced. Therefore, the first chip 310 cannot be easily peeled off from the second chip 320, and the reliability of the entire chip package is improved.

Figure 14:
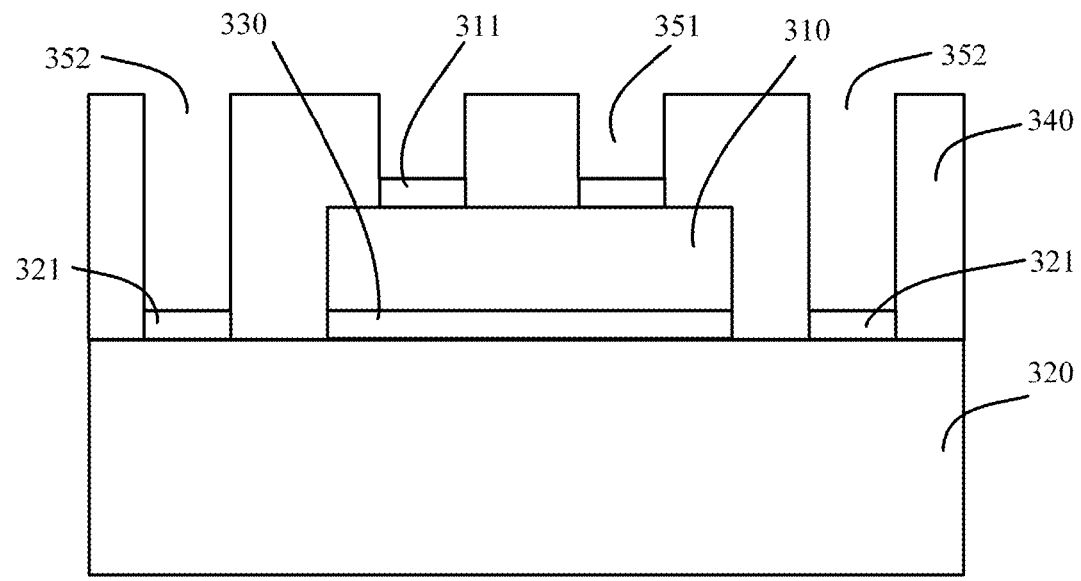

In Step S204, referring to FIG. 14, the first insulation layer 340 is etched to form a first plurality of openings 351 exposing the first plurality of pads 311, and a second plurality of openings 352 exposing the second plurality of pads 321.

Figure 15:
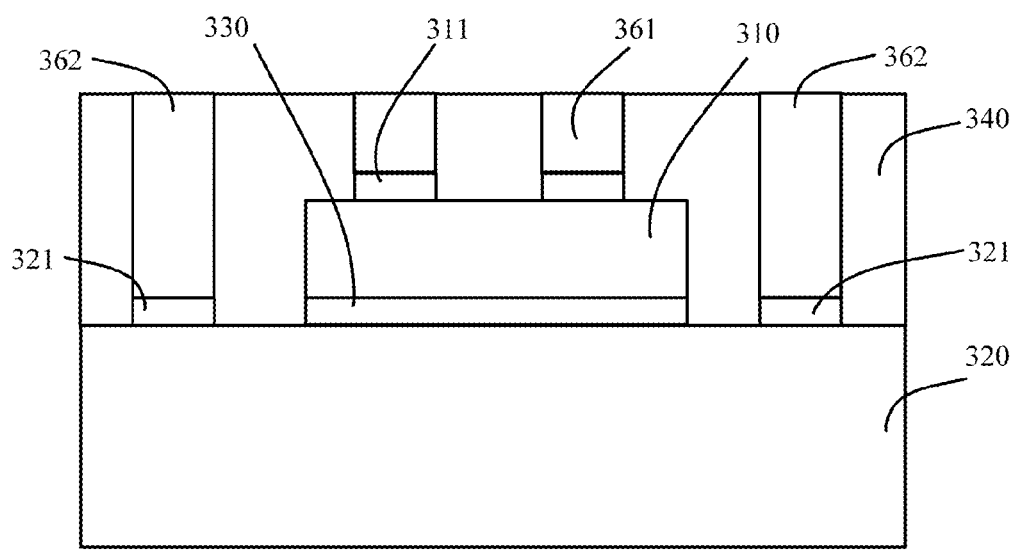

In Step S205, referring to FIG. 15, a first plurality of plugs 361 are formed in the first plurality of openings 351 (referring to FIG. 14), and a second plurality of plugs 362 are formed in the second plurality of openings 352 (referring to FIG. 14).

In some embodiments, the material of first plurality of plugs 361 and the second plurality of plugs 362 include tin, and the plugs are formed by a vacuum solder printing process. Specifically, under a vacuum environment, solder paste is filled in the first plurality of openings 351 and the second plurality of openings 352 by a printing process. Because of the vacuum environment, the solder paste can fully fill the first plurality openings 351 and the second plurality of openings 352 without leaving gaps. The solder paste in the first plurality of openings 351 forms the first plurality of plugs 361, and the solder paste in the second plurality of openings 352 forms the second plurality of plugs 362. Because the first plurality of openings 351 and the second plurality of openings 352 expose the first plurality of pads 311 and the second plurality of pads 321 respectively, after the first plurality of plugs 361 and the second plurality of plugs 362 are formed, the first plurality of plugs 361 are connected with the first plurality of pads 311, and the second plurality of plugs 362 are connected with the second plurality of pads 321. Moreover, the first insulation layer 340 exposes top surfaces of the first plurality of plugs 361 and the second plurality of plugs 362.

In some embodiments, the first plurality of plugs 361 and the second plurality of plugs 362 may include copper or other metal materials.

Figure 16:
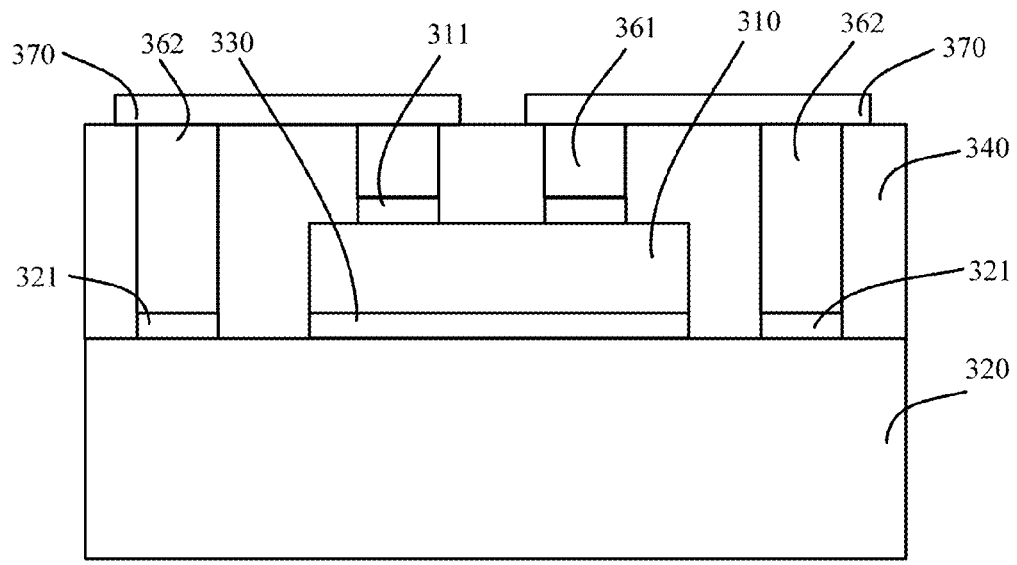

In Step S206, referring to FIG. 16, a plurality of metal interconnection structures 370 are formed on the first insulation layer 340. The metal interconnection structures 370 are connected with the first plurality of plugs 361 and the second plurality of plugs 362.

Specifically, a sputtering process is employed to form a metal material layer (not shown) on the first insulation layer 340. The metal material layer may include aluminum, titanium, copper or other conductive materials. The metal material layer covers the first plurality of plugs 361 and the second plurality of plugs 362. Next, a patterned photoresist layer is formed on the metal material layer. The patterned photoresist layer covers the area to form the metal interconnection structures on the metal material layer. Then, the metal material layer is etched to expose the first insulation layer 340 by employing the patterned photoresist layer as a mask. Then, the patterned photoresist layer is removed, and the remaining metal material layer forms the plurality of metal interconnection structures 370. The metal interconnection structures 370 are used to connect the first plurality of plugs 361 and the second plurality of plugs 362. In some embodiments, one of the first plurality of plugs 361 is connected with several of the second plurality of plugs 362. In some embodiments, several of the first plurality of plugs 361 are connected with one of the first plurality of plugs 362. In some embodiments, parts of the first plurality of plugs 361 or parts of the second plurality of plugs 362 are respectively connected with the metal interconnection structures 370, so that metal pillars formed on the metal interconnection structures 370 in subsequent steps can be connected with the parts of the first plurality of plugs 361 or the parts of the second plurality of plugs 362 respectively.

Figure 17:
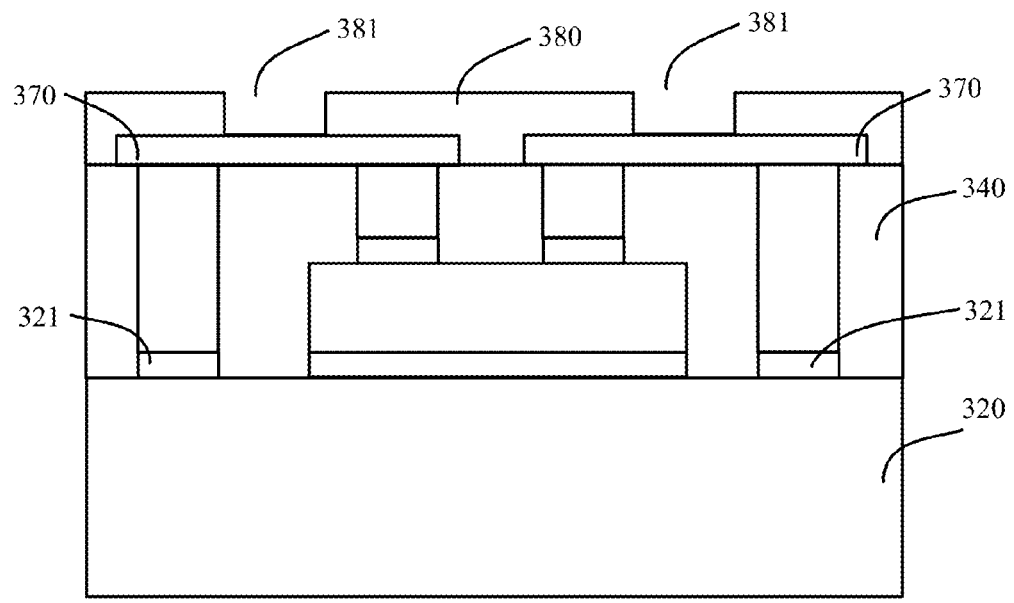

In Step S207, referring to FIG. 17, a second insulation layer 380 is formed on the first insulation layer 340 and the metal interconnection structures 370. The second insulation layer 380 has a third plurality of openings 381 exposing parts of the metal interconnection structures 370.

Figure 18:
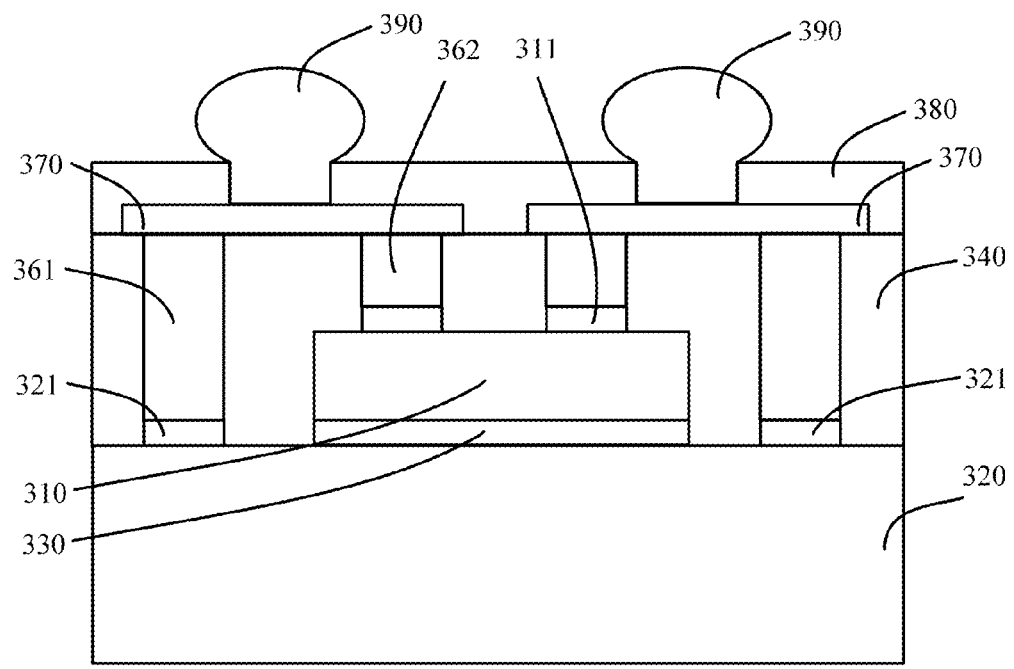

In Step S208, referring to FIG. 18, a plurality of metal pillars 390 are formed in the third plurality of openings 381.

The metal pillars 390 are connected with the metal interconnection structures 370, and are higher than or equal to the top of the second insulation layer 380.

Compared with the conventional package structure, in this embodiment, the metal pillars 390 are redistributed onto the second insulation layer 380 by forming the first insulation layer 340, the second insulation layer 380, the first plurality of plugs 361, the second plurality of plugs 362 and the plurality of metal interconnection structures 370. Therefore, the metal pillars 390 are higher than the first chip 310. There is no need to form additional openings in the PCB, and the package of the first chip 310 and the second chip 320 can be directly combined with the PCB through the metal pillars 390. Therefore, processes for forming the chip package are simplified.

Correspondingly, a chip package is provided in embodiments of the present disclosure. Referring to FIG. 18, the chip package includes: a first chip 310, a second chip 320, an insulation adhesive layer 330, a first insulation layer 340, a first plurality of plugs 361, a second plurality of plugs 362, a plurality of metal interconnection structures 370, a second insulation layer 380 and a plurality of metal pillars 390.

The first chip 310 includes a first surface (not labeled) and a second surface (not labeled) opposite to the first surface, and a plurality of pads 311 are disposed on the first surface of the first chip 310.

The second chip 320 includes a third surface (not labeled) and a fourth surface (not labeled) opposite to the third surface. A second plurality of pads 321 are disposed on the third surface of the second chip 320. The area of the second chip 320 is larger than the area of the first chip 310. The second surface of the first chip 310 is combined with the third surface of the second chip 320. The second plurality of pads 321 are out of the combination area of the first chip 310 and the second chip 320.

The insulation adhesive layer 330 is disposed between the second surface of the first chip 310 and the third surface of the second chip 320.

The first insulation layer 340 covers the first chip 310 and is combined with the second chi 320. A sum of the combination area between the first insulation layer 340 and second chip 320 and the combination area between the insulation adhesive layer 330 and the second chip 320 is larger than the area of the first chip 310. The first insulation layer 340 has a first plurality of openings (not labeled) exposing the first plurality of pads 311 and a second plurality of openings (not labeled) exposing the second plurality of pads 321. The first insulation layer 340 may be a photosensitive dry film, a non-photosensitive dry film, or molding materials.

The first plurality of plugs 361 are disposed in the first plurality of openings, and are electrically connected with the first plurality of pads 311 respectively.

The second plurality of plugs 362 are disposed in the second plurality of openings, and are electrically connected with the second plurality of pads 321 respectively.

The metal interconnection structures 370 are disposed on the first insulation layer 340, and are electrically connected with the first plurality of plugs 361 and the second plurality of plugs 362.

The second insulation layer 380 is disposed on the first insulation layer 340 and the metal interconnection structures 370, and has a third plurality of openings (not labeled) exposing parts of the metal interconnection structures 370.

The plurality of metal pillars 390 are disposed in the third plurality of openings. The plurality of metal pillars 390 are electrically connected with the plurality of metal interconnection structures 370, and are higher than the top of the second insulation layer 380.

It should be noted that, for simplicity and clarity, only one first chip and one second chip are taking as an example to describe the chip package and the method for forming the chip package of the present disclosure in above embodiments and drawings. In practical applications, a number of the first chip may be one or more, and a number of the second chip may be one or more. When the number of the first chip or the number of the second chip is more than one, the first chips or the second chips may be same chips or different chips, for example, memory chips, processing chips, image sensor chips, motion sensor chips, etc.

Figure 19:
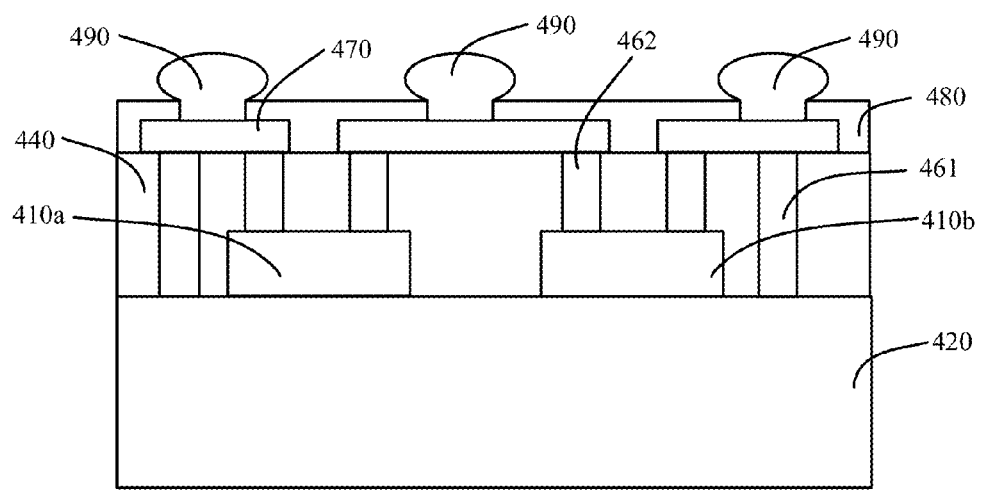
FIG. 19 schematically illustrates a cross-sectional view of a package structure including two first chips and one second chip according to another embodiment of the present disclosure.

Referring to FIG. 19, a cross-sectional view of a package structure including two first chips 410a and 410b, and a second chip 420 is illustrated according to one embodiment of the present disclosure. For clarity, a first plurality pads on first surfaces of the two first chips 410a and 410b, a second plurality of pads on a third surface of the second chip 420 and an insulation adhesive layer are not illustrated in FIG. 19. Second surfaces without pads of the two first chips 410a and 410b are combined with the third surface with pads of the second chip 420. The first plurality of pads of the two first chips 410a and 410b and the second plurality of pads of the second chip 420 are redistributed on a surface of a first insulation layer 440 and a second insulation layer 470 to connect with a plurality of metal interconnection structures 470 through a first plurality of plugs 461 and a second plurality of plugs 462, respectively. The plurality of metal interconnection structures 470 may be connected with the first plurality of pads of the two first chips 410a and 410b and the second plurality of pads of the second chip 420, or connected with the first plurality of pads of the two first chips 410a and 410b. Then, a plurality of metal pillars 490 are formed on the plurality of metal interconnection structures 470. In other embodiments, similarly to the structure shown in FIG. 7, the first plurality of pads of the two first chips 410a and 410b and the second plurality of pads of the second chip 420 may be directly connected with the plurality of metal interconnection structures 470, and there is no need to form the first plurality of plugs 461 and the second plurality of plugs 462.

Figure 20:
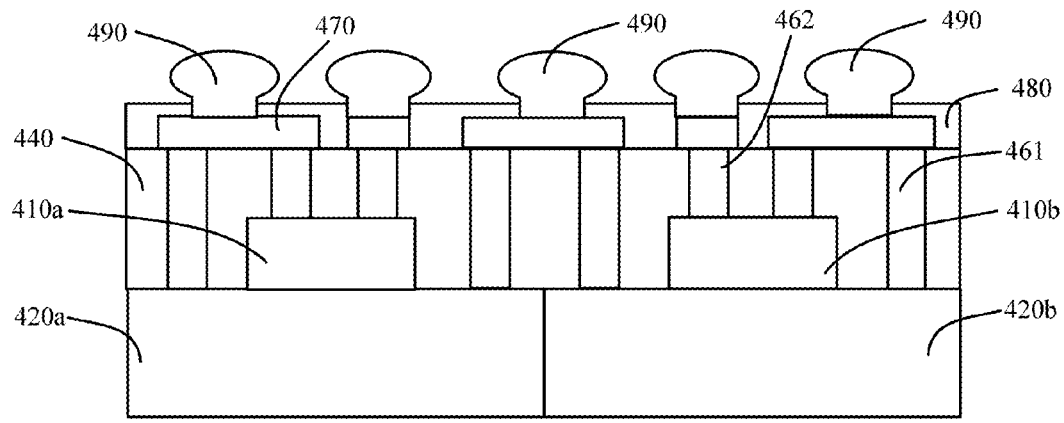
FIG. 20 schematically illustrates a cross-sectional view of a package structure including two first chips and two second chips according to another embodiment of the present disclosure.

In another embodiment, referring to FIG. 20, two first chips 410a and 410b may be combined with two second chips 420a and 420b. The plurality of metal interconnection structures 470 can be used to connect the first plurality of pads of the two first chips 410a and 410b and the second plurality pads of the two second chips 420a and 420b, or connect the second plurality of pads of the two second chips 420a and 420b. In conclusion, the present disclosure is not limited by the number of the first chips and the number of the second chips. The first plurality of pads of the first chips can be connected with the second plurality of pads of the second chips, or the first plurality of pads of different first chips can be connected with each other, or the second plurality of pads of different second chips can be connected with each other.

Moreover, it should be noted that, when the method of the present disclosure is applied on a wafer lever package, the second chip is a part of a wafer. The entire wafer is constituted by a plurality of second chips. After the first chip and the second chip are electrically connected and the plurality of metal pillars are formed, the wafer is cut to form a package structure including the first chip and the second chip. When there are a plurality of second chips formed on the wafer, the plurality of second chips may be electrically connected with a plurality of first chips. After a cutting process is performed on the wafer, a plurality of package structures including one or more first chips and one or more second chips may be obtained.

Although the present disclosure has been disclosed above with reference to preferred embodiments thereof, it should be understood by those skilled in the art that various changes may be made without departing from the spirit or scope of the disclosure. Accordingly, the present disclosure is not limited to the embodiments disclosed.

What is claimed is:

1. A method for forming a chip package, comprising:
   providing a first chip, wherein the first chip comprises a first surface and a second surface opposite to the first surface, and a first plurality of pads are disposed on the first surface of the first chip;
   providing a second chip, wherein the second chip comprises a third surface and a fourth surface opposite to the third surface, a second plurality of pads are disposed on the third surface of the second chip, and the area of the second chip is larger than the area of the first chip;
   combining the second surface of the first chip and the third surface of the second chip, wherein the second plurality of pads are out of a combination area of the first chip and the second chip; and
   forming a first insulation layer, wherein the first insulation layer covers the first chip, and is combined with the second chip, and wherein the first insulation layer covers the first plurality of pads and the second plurality of pads;
   etching the first insulation layer to form a first plurality of openings exposing the first plurality of pads, and a second plurality of openings exposing the second plurality of pads;
   forming a plurality of metal interconnection structures by applying a metal material on bottoms and sidewalls of the first openings and the second openings, and a top surface of the first insulation layer, forming a metal material layer and selectively removing the metal material layer, wherein one or more of the first plurality of pads are electrically connected to one or more of the second plurality of pads through the metal interconnection structures; and
   forming a second insulation layer on the first insulation layer and the plurality of metal interconnection structures, wherein at least part of the second insulation layer is filled in the first openings and the second openings.

2. The method according to claim 1, wherein the second surface of the first chip and the third surface of the second chip are combined through an insulation adhesive layer.

3. The method according to claim 2, wherein a sum of the combination area between the first insulation layer and the second chip and the combination area between the insulation adhesive layer and the second chip is larger than the area of the first chip.

4. The method according to claim 1, wherein the first insulation layer comprises a photosensitive dry film, a non-photosensitive dry film or a molding material.

5. The method according to claim 1, wherein the plurality of metal interconnection structures cover bottoms and sidewalls of the first plurality of openings and the second plurality of openings, and parts of the top surface of the first insulation layer, so that the plurality of metal interconnection structures are electrically connected with the first plurality of pads and the second plurality of pads.

6. The method according to claim 1, wherein the second insulation layer has a third plurality of openings exposing parts of the plurality of metal interconnection structures; and the method further comprises:
   forming a plurality of metal pillars in the third plurality of openings, wherein the plurality of metal pillars are electrically connected with the plurality of metal interconnection structures, and are higher than the top surface of the second insulation layer.

7. The method according to claim 1, wherein the second chip is a part of a wafer, and after forming the plurality of metal pillars, the method further comprises:
   cutting the wafer to form a package structure comprising the first chip and the second chip.

8. The method according to claim 1, wherein a number of the first chip is one or more, a number of the second chip is one or more, the second surfaces of the one or more first chips are combined with the third surfaces of the one or more second chips, and the first plurality of pads of the one or more first chips are electrically connected with the second plurality of pads of the one or more second chips through the plurality of metal interconnection structures, or a number of the first plurality pads of more than one first chip are connected through the plurality of metal interconnection structures, or a number of the second plurality pads of more than one second chip are connected through the plurality of metal interconnection structures.

9. A chip package, comprising:
   a first chip, wherein the first chip comprises a first surface and a second surface opposite to the first surface, and a first plurality of pads are disposed on the first surface the first chip;
   a second chip, wherein the second chip comprises a third surface and a fourth surface opposite to the third surface, a second plurality of pads are disposed on the third surface of the second chip, the area of the second chip is larger than the area of the first chip, the second surface of the first chip is combined with the third surface of the second chip, and the second plurality of pads are out of a combination area of the first chip and the second chip; and
   a first insulation layer, wherein the first insulation layer covers the first chip and is combined with the second chip, and wherein the first insulation layer covers the first plurality of pads and the second plurality of pads, the first insulation layer has a first plurality of openings exposing the first plurality of pads and a second plurality of openings exposing the second plurality of pads;
   a plurality of metal interconnection structures formed on the first pads, the second pads and a top surface of the first insulation layer by applying a metal material on bottoms and sidewalls of the first openings and the second openings, and a top surface of the first insulation layer, forming a metal material layer, and selectively removing the metal material layer, wherein one or more of the first plurality of pads are electrically connected to one or more of the second plurality of pads through the metal interconnection structures; and
   a second insulation layer, wherein the second insulation layer is disposed on the first insulation layer and the plurality of metal interconnection structures, and at least part of the second insulation layer is filled in the first openings and the second openings.

10. The chip package according to claim 9, further comprising:

an insulation adhesive layer, disposed between the second surface of the first chip and the third surface of the second chip.

11. The chip package according to claim 10, wherein a sum of the combination area between the first insulation layer and the second chip and the combination area between the insulation adhesive layer and the second chip is larger than the area of the first chip.

12. The chip package according to claim 9, wherein the first insulation layer is a photosensitive dry film, a non-photosensitive dry film or a molding material.

13. The chip package according to claim 9, wherein the plurality of metal interconnection structures cover bottoms and sidewalls of the first plurality of openings and the second plurality of openings, and parts of the top surface of the first insulation layer, so that the plurality of metal interconnection structures are electrically connected with the first plurality of pads and the second plurality of pads.

14. The chip package according to claim 9, wherein
the second insulation layer has a third plurality of openings exposing parts of the plurality of metal interconnection structures; and
the chip package further comprises: a plurality of metal pillars, wherein the plurality of metal pillars are disposed in the third plurality of openings, and are higher than the top surface of the second insulation layer.

15. The chip package according to claim 9, wherein a number of the first chip is one or more, a number of the second chip is one or more, the second surfaces of the one or more first chips are combined with the third surfaces of the one or more second chips, and the first plurality of pads of the one or more first chips are electrically connected with the second plurality of pads of the one or more second chips through the plurality of metal interconnection structures, or a number of the first plurality pads of more than one first chip are connected through the plurality of metal interconnection structures, or a number of the second plurality pads of more than one second chip are connected through the plurality of metal interconnection structures.

* * * * *